United States Patent [19]
Rayner

[11] Patent Number: 6,097,885
[45] Date of Patent: Aug. 1, 2000

[54] DIGITAL SYSTEM SIMULATION

[75] Inventor: James Edward Rayner, Stockport, United Kingdom

[73] Assignee: International Computers Limited, London, United Kingdom

[21] Appl. No.: 08/972,821

[22] Filed: Nov. 18, 1997

[30] Foreign Application Priority Data

Jan. 16, 1997 [GB] United Kingdom ................... 9700798

[51] Int. Cl.[7] .................................................. G06F 9/455
[52] U.S. Cl. ........................................ 395/500.38; 710/54
[58] Field of Search .................................. 364/578, 200, 364/900; 395/500, 500.38, 500.34, 500.37; 710/54, 55; 706/45

[56] References Cited

U.S. PATENT DOCUMENTS

| 4,394,725 | 7/1983 | Bienvenu et al. | 364/200 |
|---|---|---|---|
| 4,787,061 | 11/1988 | Nei et al. | 364/900 |
| 4,965,743 | 10/1990 | Malin et al. | 706/45 |
| 5,111,413 | 5/1992 | Lazansky et al. | 364/578 |
| 5,513,339 | 4/1996 | Agrawal et al. | 395/500 |
| 5,701,439 | 12/1997 | James et al. | 395/500.38 |
| 5,794,005 | 8/1998 | Steinman | 395/500.38 |
| 5,805,470 | 9/1998 | Averill | 364/578 |
| 5,809,284 | 9/1998 | Fujisawa | 395/500 |

OTHER PUBLICATIONS

M. Rao., "Implementation and Evaluation of a Parallel PMS Simulator", Int'l Conference on Databases, Parallel Architectures and Their Applications, PARBASE–90, 1990, pp. 408–416.

*Primary Examiner*—Kevin J. Teska
*Assistant Examiner*—Russell W. Frejd
*Attorney, Agent, or Firm*—Lee, Mann, Smith, McWilliams, Sweeney & Ohlson

[57] ABSTRACT

A simulator for a digital system comprises a simulation model, an event queue for scheduling changes to the state of the simulation model at specified times, and a separate delta queue, for scheduling changes to the state of the simulation model that are to take place instantaneously. The use of separate event and delta queues facilitates optimization of the queuing. The simulation model comprises a number of replaceable parts, each of which contains and is responsible for managing its own state information. The event and delta queues contain references to the parts of the model for which changes of state are scheduled, without containing the actual values of those changes of state.

8 Claims, 6 Drawing Sheets

DIGITAL SYSTEM SIMULATION

BACKGROUND TO THE INVENTION

This invention relates to simulation of digital systems. The invention is particularly, although not exclusively, concerned with simulating complex logic networks, such as are found in electronic computers.

Conventional simulators use a queue to schedule changes to the state of the simulated system. Whenever it is determined that the state is to change, a record containing the new state value is added to the appropriate position of the queue. In operation, the queue is scanned sequentially, to simulate the passage of time and, as each record is scanned, the new state values specified by that record are set.

The VHDL simulation language [ANSI/IEEE Standard 1076] uses signals to propagate changes of state around the simulation model. Signals are classified as unresolved and resolved. Unresolved signals are those that have only one driving source, while resolved signals have more than one driving source. A resolution process is used to handle resolved signals, so as to resolve the values from the different sources.

Unresolved signals may be either event-based or delta-based. Event-based signals have explicit time delays associated with them. Delta-based signals, on the other hand, represent changes that are assumed to take place instantaneously; i.e. they do not have any explicit time delays associated with them. Delta-based signals are used to ensure order independence for concurrent processes, and to ensure that changes to the signal value take place only when all the concurrent processes have completed their execution for the current time unit. In the case of an event-based signal, a record is added to the queue at the appropriate time position, taking account of the time delay for that signal. In the case of a delta-based signal, a record is added at the position in the queue corresponding to the current simulation time.

Conventional VHDL simulators use a centralised kernel to control the operation of the simulation model. Such a kernel requires a fixed data format, to which all data types used in the simulation must conform, to represent changes of state of the model, and requires a range of generalised routines for handling all these changes.

A problem is that when the simulated network is large and complex, the simulation can be very slow and hence take a very long time to run. Also, the complexity of the kernel is a problem, if it is required to maintain a high level of performance while enabling the kernel to deal with each data type in whatever form. Every adjustment to the kernel becomes performance-critical, and some data types cannot be added for fear of losing simulation performance.

The object of the present invention is to provide a way of improving the performance of a simulation system, so as to increase the speed of simulation.

SUMMARY OF THE INVENTION

According to the invention a simulator for simulating a digital system comprises a simulation model, an event queue for scheduling changes to the state of the simulation model at specified times, and a separate delta queue, for scheduling changes to the state of the simulation model that are to take place instantaneously.

It will be shown that the use of separate event and delta queues in this way makes it possible to perform a number of optimizations that would not be possible in a conventional simulator with a single queue for both events and deltas.

Preferably, the simulation model comprises a number of replaceable parts, each of which contains its own state information and is responsible for managing its own state information, and the event and delta queues contain references to the parts of the model for which changes of state are scheduled, without containing the actual values of those changes of state.

It will be shown that this makes possible a number of further optimizations that would not be possible in a conventional simulator with a centralised kernel.

DESCRIPTION OF AN EMBODIMENT OF THE INVENTION

One simulator in accordance with the invention will now be described by way of example with reference to the accompanying drawings.

Overview of the Simulator

Figure 1:
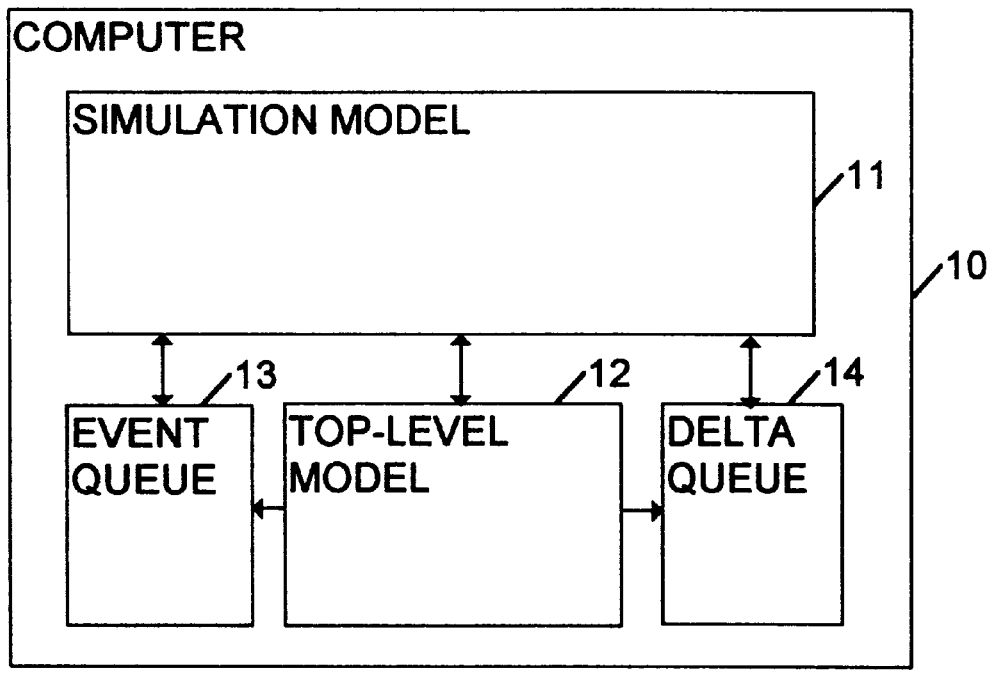
FIG. 1 is a schematic block diagram of a computer system embodying a simulator in accordance with the invention.

Referring to FIG. 1, the simulator comprises a general-purpose computer 10, which contains a number of software components, including a simulation model 11, a top-level model 12, an event queue 13, and a delta queue 14.

The simulation model 11 simulates a specific logic network. The top-level model 12 provides a framework for running the simulation model, and is generic to a range of simulation models.

The event and delta queues 13, 14 are used for scheduling changes to the state of the model. The event queue schedules changes that are to take place at specific times, while the delta queue schedules changes that are assumed to take place instantaneously.

The simulator uses two forms of simulated time: event time and delta time. Event time is measured in time units such as nanoseconds. Delta time is simply an integer which is incremented each time the delta queue is processed, i.e. each time a pop_deltas( ) function (see below) is executed.

Simulation Model

Figure 2:
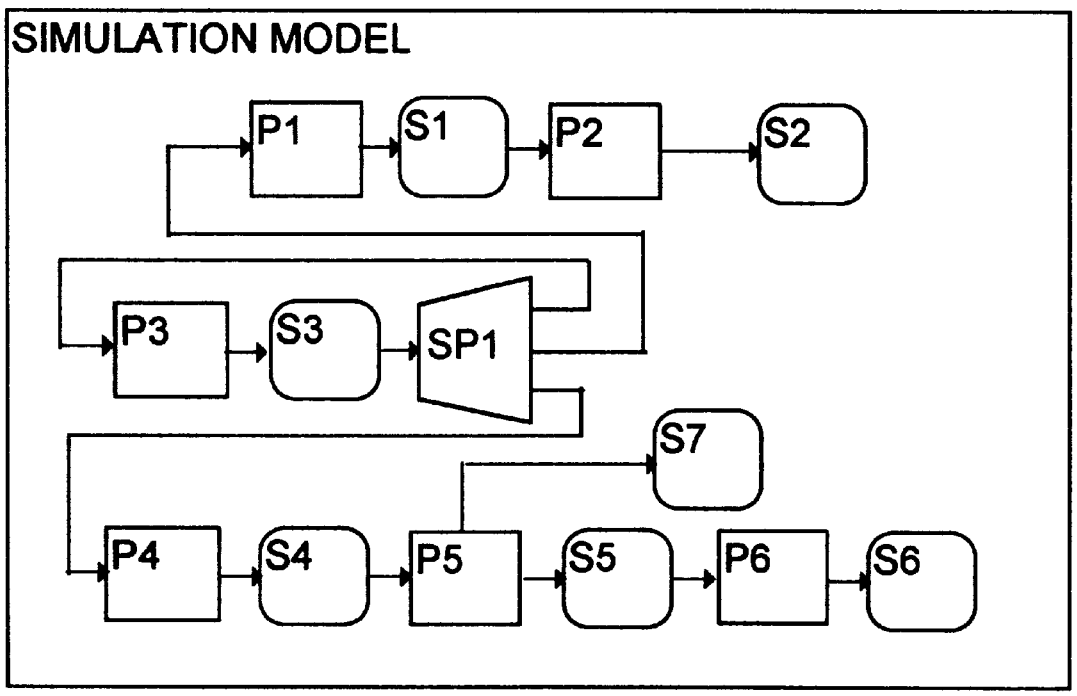
FIG. 2 is a schematic diagram of a simulation model.

FIG. 2 shows a simplified example of a simulation model 11. The model comprises a number of process objects P1–P6 and signal objects S1–S7, each of which represents a changeable part of the simulation model. Each object has a state, represented by one or more data structures, and a behaviour, represented by a number of functions, as will be described. Each of these objects is created as an instance of a generalised class. It will be appreciated that, in general, simulation models will be much more complex than that shown in this drawing, and will include many more objects.

The process objects represent specific functional parts of the simulated logic network, such as VHDL processes. The signal objects represent signals between these parts. A process object may change the state of one or more signal objects: in FIG. 2 for example, process object P1 changes the state of signal object S1. A process object may, in turn, be dependent on (driven by) one or more signal objects: in FIG. 2 for example, P2 is driven by S1. It is also possible for one process object to directly call another process object, without any intervening signal object.

In general, many of the signal objects do not drive any process objects. These signal objects serve only as state holders, for storing state values, rather than to link one process object to another. In this example, S2, S6 and S7 do not drive any process objects.

A simulation model may also include other types of object, in addition to process objects and signal objects. For example, the model may include a combined process/signal object which represents both a process and a signal. This might be used, for example, to simulate a state machine or a clocked process.

Split Processes

Each signal object may directly drive only one process object at most. If the model requires a particular signal to drive more than one process, a split process is introduced between the signal object and the dependent process objects. In FIG. 2 for example, the split process SP1 allows the signal object S3 to drive three dependent process objects: P1, P3 and P4. This restriction improves the efficiency of the model, since it avoids the need for complex code to handle the driving of a number of processes. Also, it reduces the number of queuing operations since it means that only a single queuing operation is required, rather than one for each of the dependent process objects.

A split process may simply contain a sequence of calls to the entry( ) functions of each of its dependent process objects. For example, the split process SP1 in FIG. 2 may consist of calls to the entry( ) functions of P1, P3 and P4. A split process may also perform some processing. For example, a split process may test the value of a particular signal, such as a clock signal, and call different functions according to whether that signal is TRUE or FALSE.

Process Objects

A typical process object P has a state, represented by one or more data structures. These data structures may represent internal state data, i.e. the variables of the process.

A typical process object also comprises two functions:
init( ): an initialisation function.
entry( ): an entry function.

Signal Objects

A typical signal object S comprises the following state data:

old_state: the old state of the signal object.
new_state: the new state of the signal object.
altered: a flag indicating whether or not the state of the signal object has been altered.
proc_ptr: a pointer to the process object (if any) that is driven by this signal object. For example, in FIG. 2, the proc_ptr of S1 points to P2. If the signal object does not drive any process object, this pointer is null.
last_delta_time: the last delta time value for which a change to this signal object has been scheduled on the delta queue.
last_event_time: the last event time value for which a change to this signal object has been scheduled on the event queue.

In addition, a typical signal object contains the following functions:

init( ): initialises the old_state of the signal object, either to a user-specified value, or to a default value. The init( ) function also initialises the various flags in the signal object, and the last delta and event times.
change_state( ): sets the old_state value of the signal object to the new_state value.
send_event( ): schedules a change to the state of the signal object, by placing a record on the delta queue or the event queue (depending on whether the signal object is delta based or event based).
fire_event( ): calls the entry( ) function of the dependent process specified by proc_ptr.

Resolved signals (i.e. signals with more than one driving source) are represented by signal objects similar to those for unresolved signals. However, the fire_event( ) function is more complex in the case of a resolved signal, since it is required to make calls backwards, as well as forwards, to ensure that all process objects sensitive to changes of the resolved signal are called.

Event Queue

The event queue 13 comprises a linked list of records, each of which represents a scheduled change of state of a particular signal object. Each event record contains the following fields:

Reference: a pointer to a signal object.
Event_time: the event time at which the referenced signal object is scheduled to change its state. The records in the event queue are maintained in order of increasing event_time value.
Next: a pointer to the next record in the event queue. If this is the last record in the queue, the pointer is null.

The event queue has two functions associated with it:
push_event(reference, event_time): adds a new event record at appropriate position in the event queue, according to the value of event_time. The parameters (reference, event_time) determine the reference and event_time fields of the new event record.
pop_events( ): processes records on the event queue.

Delta Queue

The delta queue comprises a linked list of records, each of which represents a scheduled change of state of a particular signal object. The changes scheduled on the delta queue are assumed to take place instantaneously; i.e. they do not have any explicit time delays associated with them.

Each record in the delta queue contains the following fields:

Reference: a pointer to a signal object.
Next: a pointer to the next record in the delta queue. If this is the last record in the queue, the pointer is null.

The delta queue has two functions associated with it:
push_delta(reference): adds a new delta record to the delta queue. The parameter determines the reference field of the new delta record. The new record is always added to the end of the delta queue.
pop_deltas( ): processes records on the delta queue.

It should be noted that the event and delta queues do not hold the actual values of the changes of state; instead, they simply hold references to the signal object whose state is scheduled to change. It is the responsibility of the signal objects to handle their own changes of state in the most efficient way.

Top-Level Model

Figure 3:
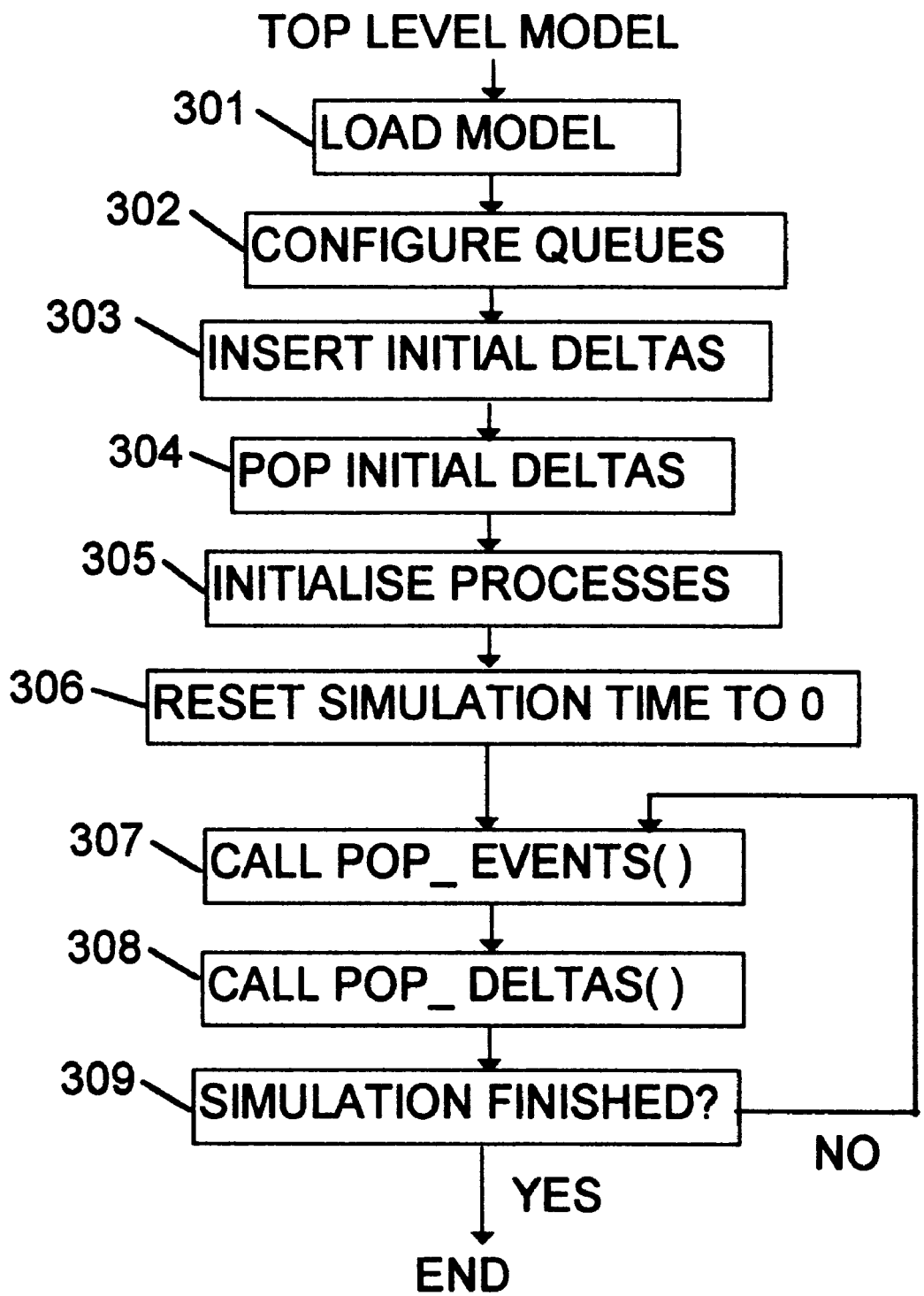
FIG. 3 is a flow chart of a top-level model used in the simulator.

The top-level model 12 will now be described with reference to FIG. 3.

(Step 301) The top-level model first loads the simulation model, and calls the init( ) function of each process in the model, so as to set up the required data structures for each process.

(Step 302) The top-level model then selects the optimum form of event and delta queues for the model, and configures each queue to this optimum form.

Selection of the form of event queue is based on information obtained during the initialisation. This information includes the number of event-based signals in the model, and the smallest time delay unit used in the model, and the range of time delays. The following options are available for the form of event queue:

No event queue: this is chosen if the model does not contain any event-based signal objects. In this case therefore, there is no event queue overhead.

Single event queue: this is chosen if the model contains only one event-based signal object, and this signal object holds only one state change at a time. This is the fastest form of queue, since no insertion operation is required.

Multiple event queue: this option is chosen when the model contains more than one event-based signal object, or contains a single event-based signal object that can contain more than one state change, and when the range of time delays is relatively small.

Multiple event, large time base range queue: this is the slowest form of queue, but is capable of handling a relatively large range of time delays.

(Step 303) An initial set of delta records is inserted on the delta queue.

(Step 304) These initial delta records are then popped off the delta queue, so as to perform an initial setting of the signal values. This uses a pop_initialisation_deltas( ) function.

(Step 305) Each process object in the model is initialised, by calling its entry( ) function. This may result in further deltas being generated and inserted on the delta queue for the next delta time.

(Step 306) The current event time and current delta time are both reset to zero.

(Steps 307–309) The top-level model then enters a main loop, in which the pop_events( ) function and the pop_deltas( ) function are called alternately. This loop continues until either the event queue becomes empty, or until the simulation time reaches a specified simulation end time.
Pop_Deltas( )

Figure 4:
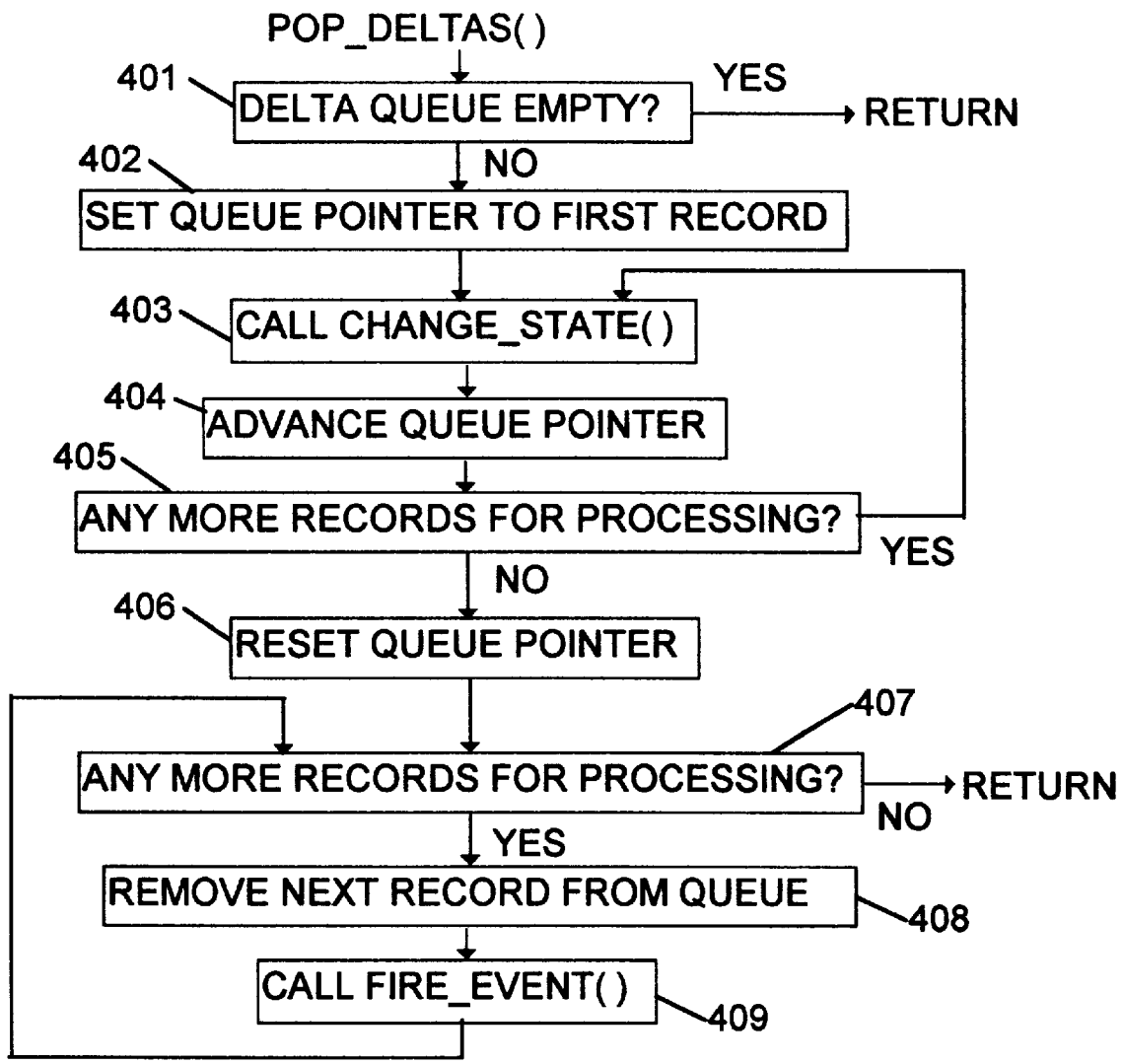
FIG. 4 is a flow chart of a pop_deltas( ) function.

The pop_deltas( ) function will now be described with reference to FIG. 4.

(Step 401) If the delta queue is empty, the function returns. Otherwise, it proceeds to step 402.

(Step 402) A queue record pointer is set to the first record in the delta queue.

(Step 403–405) A loop is performed, in which each record in the delta queue is selected in turn. For each of these records, the change_state( ) function of the signal object referenced by this record is called. The change_state( ) function updates the state of the referenced signal object, by setting its old_state value equal to its new_state value. This loop is repeated until the record pointer is null, indicating that the last record in the delta queue has been reached.

(Step 406) The queue record pointer is reset to the first record in the delta queue.

(Steps 407–409) A loop is performed in which each record in the delta queue is selected in turn. The selected record is removed from the delta queue, and the fire_event( ) function of the signal object referenced by this record is called. This loop is repeated until all the current records in the delta queue have been removed.

The fire_event( ) function may result in further delta records being created and added to the end of the delta queue. These new delta records are not processed during this run of the pop_deltas( ) function; they are processed at the next delta time (i.e. during the next run of the pop_deltas( ) function).

The pop_initialisation_deltas( ) function is similar to the pop_deltas function, except that steps 406–409 are omitted. Hence, in this case, the fire_event( ) function is not called, and so no propagation of signals takes place.
Pop_Events( )

Figure 5:
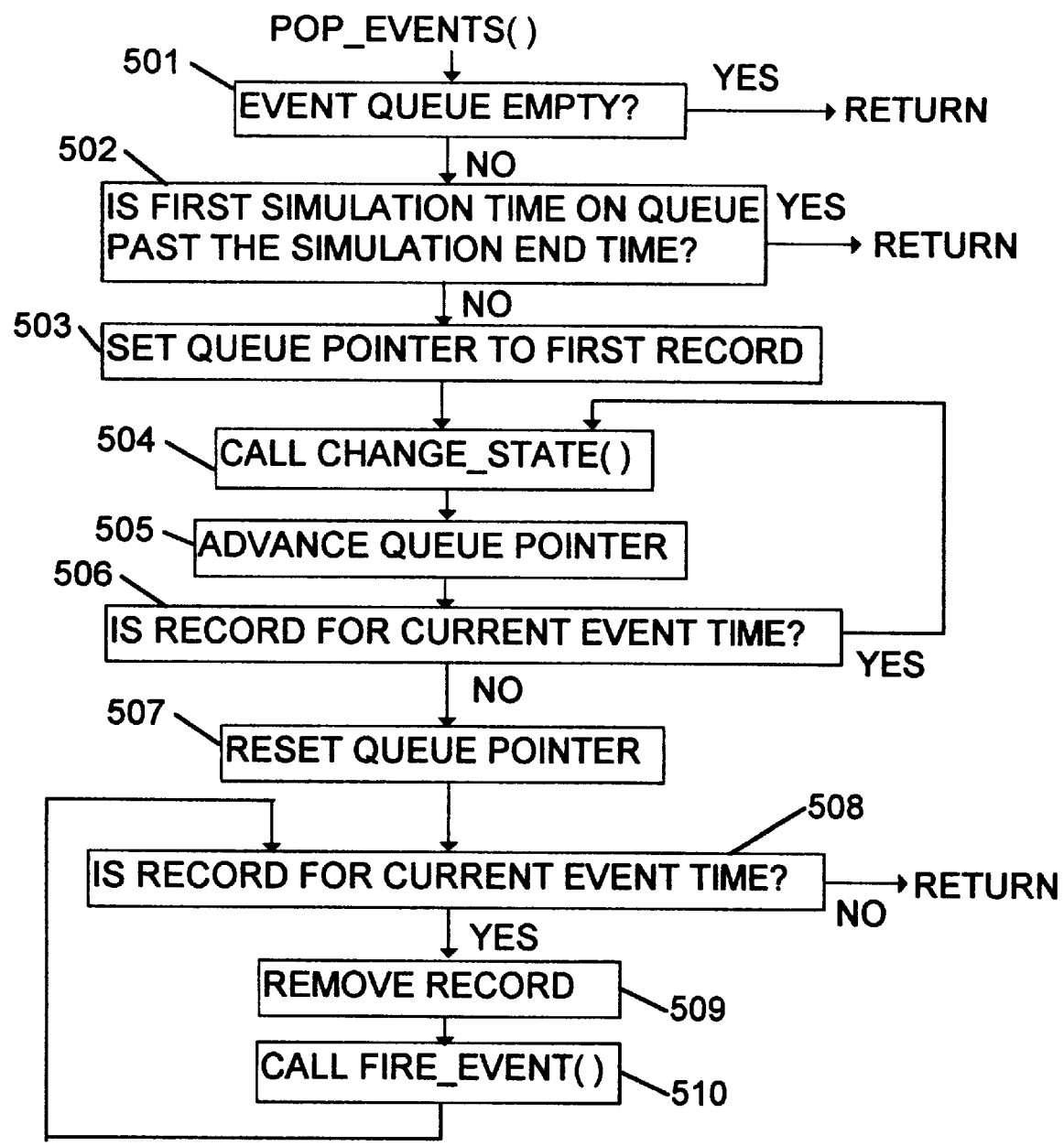
FIG. 5 is a flow chart of a pop_events( ) function.

The pop_events( ) function will now be described with reference to FIG. 5.

(Step 501) If the event queue is empty, the function returns. Otherwise, it proceeds to step 502.

(Step 502) A check is made to determine whether event_time value of the first record on the event queue is past (i.e. greater than) the specified simulation end time. If so, the function returns.

(Step 503) A queue record pointer is set to point to the first record in the event queue, and the current event time is set equal to the event_time value of this record.

(Steps 504–506) A loop is performed in which each record on the event queue is selected in turn. For each of these records, the change_state( ) function of the signal object referenced by the record is called. The change_state( ) function updates the state of the referenced signal object, by setting its old_state value equal to its new_state value. This loop is repeated until the event_time value of the selected record is greater than current event time.

(Step 507) The queue record pointer is then reset to the first record in the event queue.

Figure 6:
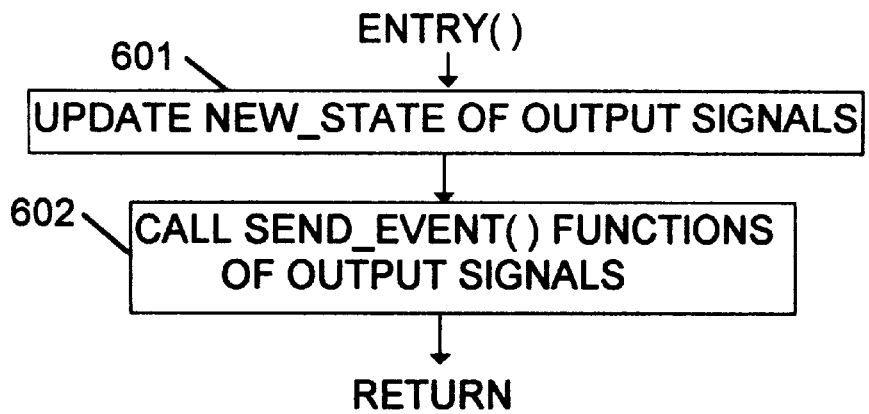
FIG. 6 is a flow chart of an entry( ) function.

(Steps 508–510) A loop is performed in which each record in the event queue is selected in turn. The selected record is removed from the event queue, and the fire_event( ) function of the signal object referenced by this record is called. This loop is repeated until the event_time value of the selected record is greater than current event time.
Entry( ) Function Each process object has its own entry( ) function, specific to that process object. FIG. 6 shows the entry( ) function of a typical process object.

(Step 601) The function reads the old_state values of any input signal objects, performs user-defined processing operations, and updates the new_state value of any output signal objects. For example, in FIG. 2, the process object P2 reads the old_state value of S1, and updates the new_state value of S2. The updating of the new_state value sets the altered flag of the signal object to TRUE.

It should be noted the old_state of the output signal object is not updated at this stage. Hence, any other process objects that are fired at the same delta time (or event time) will still use the same old_state value. The old_state values are not updated until the next run of the pop_deltas( ) or pop_events( ) function, as described above.

(Step 602) After completion of all user-defined processing operations, the entry( ) function calls the send_event( ) function of every signal object whose state it may possibly have updated during the processing.
Send_event( )

Figure 7:
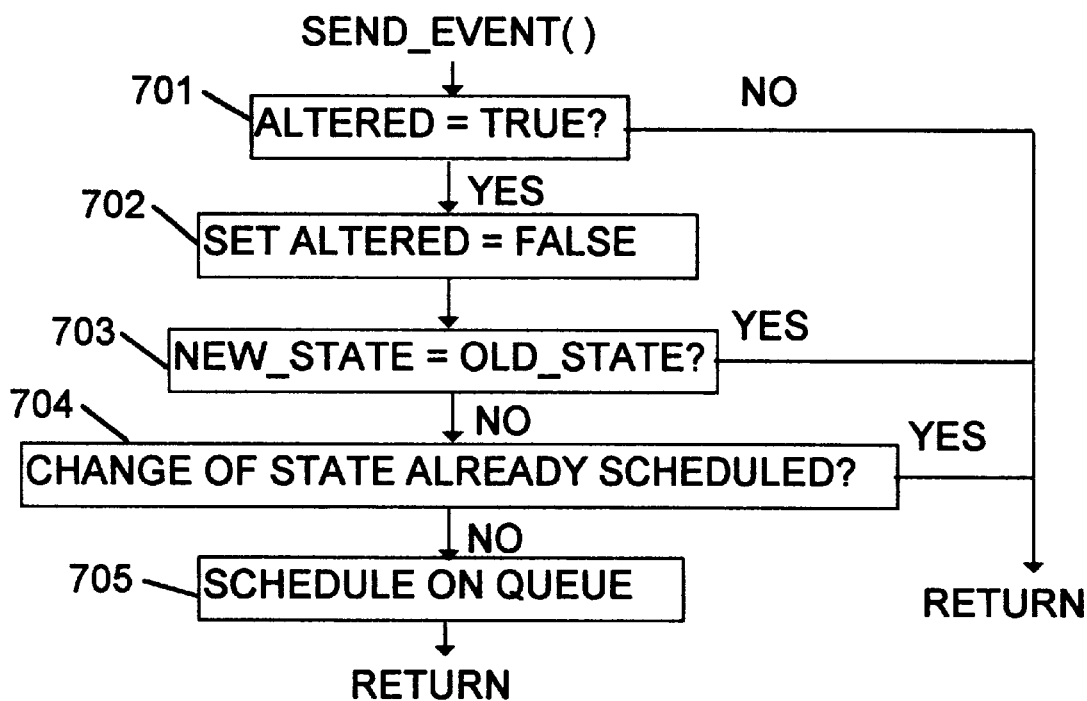
FIG. 7 is a flow chart of a send_event( ) function.

FIG. 7 shows the send_event( ) function of a typical signal object. It is assumed in the following description that the signal object is event-based.

(Step 701) The function first checks whether the altered flag of the signal object is TRUE. If so, the function proceeds to step 702, otherwise, it returns.

(Step 702) The value of the altered flag for the signal object is reset to FALSE.

(Step 703) The function then checks whether the new_state value of the signal object is equal to its old_state value. If so, the function returns.

(Step 704) The function then checks whether a change to the signal object has already been scheduled on the event queue for exactly the same time as the change currently being processed. This step involves checking whether event_time (i.e. the event time at which the signal is scheduled to change) is greater than the value of last_event_time for this signal object. If not, then a change has already been scheduled, and no further action is taken by this function.

(Step 705) Assuming that all the above checks are satisfactory, the value of last_event_time for the signal object is set equal to event_time. The change is then scheduled, by calling push_event(this, event_time), where "this" represents a pointer to this signal object. This adds a new record to the appropriate position in the event queue.

It can be seen that the tests described above ensure that a signal is queued only if its values have changed and if a change for that signal has not already been queued. This reduces the number of queuing operations, and hence helps to improve the running speed of the model.

As stated, the above description of FIG. 7 assumes that the signal object is event-based. If it were delta-based, Steps 74 and 75 would be replaced by step 704*a* as follows.

(Step 704*a*) The change is scheduled, by calling push_delta(this), where "this" represents a pointer to this signal object. This adds a new record to the end of the delta queue.
Fire_Event( )

Figure 8:
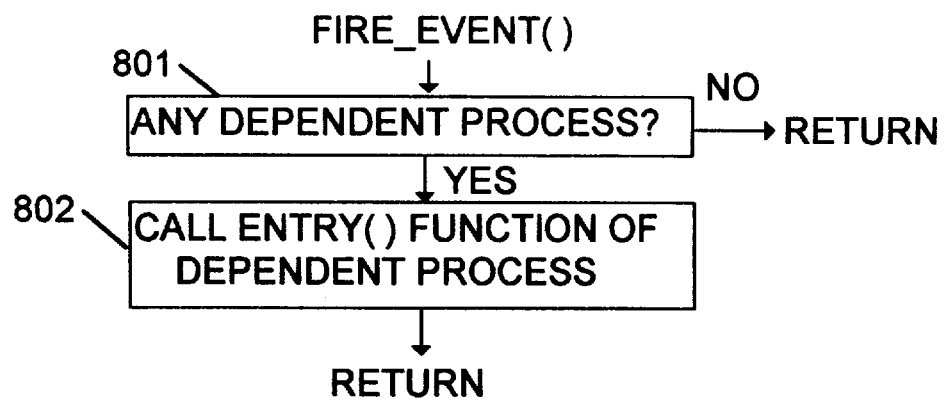
FIG. 8 is a flow chart of a fire_event( ) function.

FIG. 8 shows the fire_event( ) function of a typical signal object.

(Step 801) The function first checks whether the proc_ptr for the signal object is null. If proc_ptr is null, this means that the signal object does not have any dependent process objects, and so no further action is taken by this function.

Figure 9:
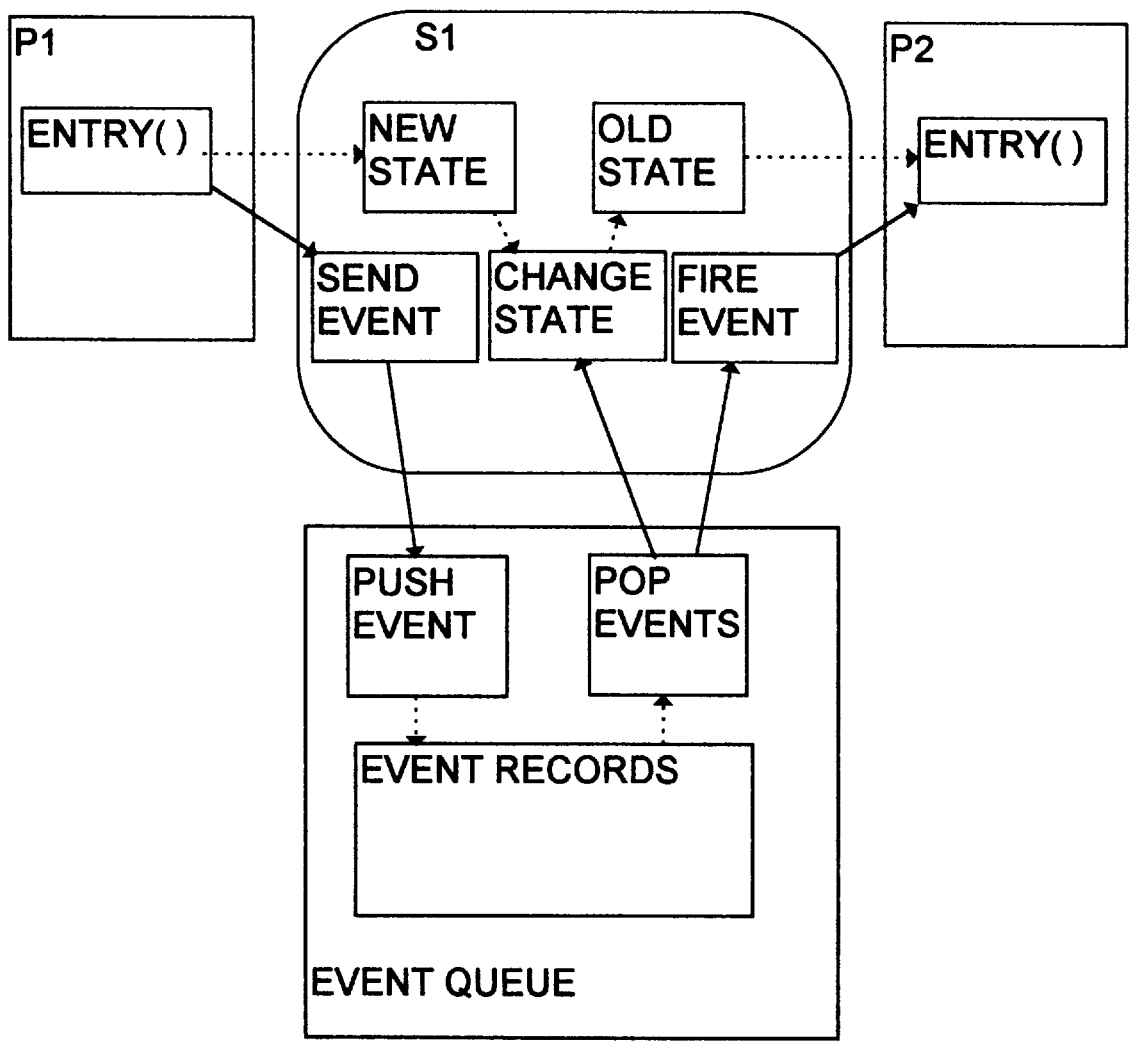
FIG. 9 is a schematic diagram of part of the simulator.

(Step 802) Assuming that proc_ptr is non-null, the entry( ) function of the dependent process pointed to by proc_ptr is called.
Operation The operation of the simulator will now be illustrated, with reference to FIG. 9, which shows process objects P1, P2, signal object S1, and the event queue. It is assumed that S1 is event-based.

When the entry( ) function of Pi runs, it updates the new_state value of its output signal S1. It then calls the send_event( ) function of S1, after it has performed any other user-defined processing.

The send_event( ) function calls the push_event( ) function of the event queue, which causes an event record to be added to the event queue, for a specified event time.

When the specified event time arrives, the pop_events( ) function removes this record from the event queue, and calls the change_state( ) function of S1. This causes the old_state of S1 to be set equal to its new_state. Pop_events then calls the fire_event( ) function of S1. This calls the entry( ) function of the dependent process object P2.

In summary, it can be seen that the effect of this is that a signal is communicated from P1 to P2, with a specified delay.
Discussion An important feature of the simulation technique described above is the use of separate event and delta queues. The two different forms of time, delta time and event time, have different forms of queuing action as well as different optimizations, and so the use of separate event and delta queues makes it much easier to optimize the queuing actions. For example, the form of the event queue can be optimized as described above.

Another important feature of the simulation technique is that each changeable part of the simulation model is implemented as a separate object, and each object is responsible for handling its own changes of state. As a result, the state of each part can be held in an optimum format, rather than having to use a standard format, as is required in conventional kernel-based simulators. Moreover, the routines needed to change the state of a model part can be specifically designed for that part, rather than relying on a generalised routine in a kernel. This allows a large number of discrete optimizations to be applied to the individual model parts so as to increase the speed of the simulation.

Since each part of the model controls its own state, the queues do not need to hold the actual values of the changes of state; instead, they can simply hold references to the model parts whose states are scheduled to change. This greatly simplifies the queuing actions, since values do not have to be copied to and from store, and complex data structures can be dealt with by their owning parts, rather than by generalised queuing routines. This leads to further improvements in efficiency.
Some Possible Modifications It will be appreciated that many modifications may be made to the system described above without departing from the scope of the present invention. For example, the queues may be based on timing loops, as described in our U.S. Pat. No. 5,157,620, rather than being constructed as linked lists.

I claim:

1. A simulator for simulating a digital system, the simulator comprising:
    (a) a simulation model;
    (b) an event queue for scheduling changes to the state of the simulation model at specified times; and
    (c) a separate delta queue, for scheduling changes to the state of the simulation model that are to take place instantaneously;
    (d) wherein said simulation model comprises a plurality of replaceable parts, each of which contains its own state information and is responsible for managing its own state information.

2. A simulator according to claim 1 wherein the event and delta queues contain references to the parts of the model for which changes of state are scheduled, without containing the actual values of those changes of state.

3. A simulator according to claim 2 wherein the parts of the model include process objects and signal objects.

4. A simulator according to claim 3 wherein each of the signal objects directly drives at most one of the process objects, and including at least one split process positioned between a signal object and a plurality of process objects, for allowing that signal object to drive the plurality of process objects indirectly.

5. A simulator according to claim 1 including means for selecting an optimum form of said event queue.

6. A simulator according to claim 1 including means for checking that a state value has actually changed, and that this change of state has not already been added to the event queue or delta queue, before adding that change to the event queue or delta queue.

7. A method for simulating a digital system, comprising the steps:
    (a) adding event records to an event queue, said event records representing changes to the state of a simulation model that are scheduled to occur at specified times;
    (b) adding delta records to a delta queue, separate from said event queue, said delta records representing changes to the state of the simulation model that are to take place instantaneously;
    (c) periodically removing event records corresponding to a current simulation time from said event queue, and performing simulation processes for those event records; and
    (d) periodically removing all delta records from said delta queue and performing simulation processes for those delta records.

8. A method according to claim 7 further including selecting an optimum form of said event queue.

* * * * *